United States Patent [19]

Kim

[11] Patent Number: 4,999,310

[45] Date of Patent: Mar. 12, 1991

[54] METHOD OF MAKING AN LED ARRAY

[75] Inventor: Ki-Joon Kim, Seoul, Rep. of Korea

[73] Assignee: SamSung Electronics Co., Ltd., Sywon, Rep. of Korea

[21] Appl. No.: 399,954

[22] Filed: Aug. 29, 1989

[30] Foreign Application Priority Data

Dec. 17, 1988 [KR] Rep. of Korea ............... 1988-16845

[51] Int. Cl.$^5$ ........................................... H01L 33/00
[52] U.S. Cl. ..................................... 437/51; 437/129; 437/127; 437/167; 437/181; 437/905; 437/23; 357/17; 148/DIG. 99
[58] Field of Search ............... 437/129, 127, 167, 181, 437/905, 23; 357/17; 148/DIG. 99

[56] References Cited

U.S. PATENT DOCUMENTS

| | | | |
|---|---|---|---|
| 4,032,951 | 6/1977 | De Winter et al. | 437/129 |
| 4,053,914 | 10/1977 | Goodwin | 437/905 |
| 4,176,367 | 11/1979 | Vematsu | 357/17 |
| 4,280,858 | 7/1981 | Van Opdorp et al. | 432/167 |
| 4,297,783 | 11/1981 | Casey, Jr. et al. | 437/905 |
| 4,879,250 | 11/1989 | Chan | 437/905 |

FOREIGN PATENT DOCUMENTS 53-3784 1/1978 Japan .

Primary Examiner—Olik Chaudhuri
Assistant Examiner—G. U. Hugo
Attorney, Agent, or Firm—Robert E. Bushnell

[57] ABSTRACT

A method of making an LED array capable of enhancing an internally generated light density with heterojunction by supporting the LED array with a current injection region by growing heterogeneous film and diffusing a zinc impurity. The improved LED array is capable of producing a high optical power by radiating efficiently a generated light beam without disturbance. To achieve the objects of the present invention, the method comprises: a first process for sequentially growing an n-type junction layer, a p-type radiative layer, a current blocking layer and n-type transparent layer over a semiconductor substrate; a second process for photo-etching the current blocking layer and n-type transparent layer in order to inject current; a third process for diffusing zinc impurity to form current injection region by electrically connecting p-type electrode with p-type radiative layer over the surface of current blocking layer as n-type transparent layer; a fourth process for performing a photo-etching so as to separate each element; and a fifth process for forming respective electrodes over the surface and inside of element.

1 Claim, 3 Drawing Sheets

METHOD OF MAKING AN LED ARRAY

BACKGROUND OF THE INVENTION

1. Field of the invention

The present invention relates to a light emitting diode (LED) array, and more particularly to a method of making a semiconductor LED in which an internally emitted light can be efficiently radiated to the outside by forming current injection region and current blocking layer by using the diffusion of zinc.

2. Description of the Prior Art

At a high information-oriented age, as data processing capability of office-automation devices such as computer increases continuously, a printer as its data outputing device also requires high-speed, high-resolution and multi-functions. As a result, for such a requirement, an LED array which is a light source of an optical printer employing an electro-photographic technique is asked for a high optical power and resolution. However, when a radiative area is narrowed to achieve high-resolution, it is difficult to obtain high optical power, therefore, a photoemission efficiency must be enhanced.

FIGS. 1 and 2 show a portion of a known LED array, wherein a reference numeral 1 is a GaAs substrate, 2 is an n-type GaAsP film, 3 is a zinc diffusion region, 4 is an insulating film, 5 is a p-type electrode, and 6 is an n-type electrode, respectively. In case of making a p-n junction by using the zinc diffusion, P-type and n-type semiconductor are of the same material, resulting in a homojunction, therefore a high-speed printing can't be accomplished due to a low optical output power. Recently in order to perform a high-speed printing, the heterojunction structure is studied, as shown in FIG. 2.

Referring now to FIG. 2(A), a known LED array includes a GaAs substrate 11, a p-type GaAlAs radiative layer 12, a GaAlAs transparent layer 13, an n-type cap layer 14, an n-type electrode 15, a p-type electrode 16, and a internal radiative region 17, respectively.

However, in case of comprising the elements in said manner, when a voltage is applied to an element, the internal light-density is high as shown in FIG. 2(B), but the radiative region 17 is formed under the electrode 15, therefore, when the light is radiated to the outside, a great loss is brought due to the disturbance of the electrode 15 as shown in FIG. 2(C).

SUMMARY OF THE INVENTION

It is an object of the present invention to provide a method of making an LED array capable of enhancing an internally generated light-density from its heterojunction by supporting the LED array with a current injection region by means of growing heterogeneous film and diffusing a zinc impurity.

It is another object of the present invention to provide a method of making an LED array capable of producing a high optical power by radiating efficiently a generated light beam without disturbance.

To achieve the objects of the present invention, the method comprises: a first process for sequentially growing an n-type junction layer, a p-type radiative layer, an n-type current blocking layer and transparent layer over a semiconductor substrate; a second process for photo-etching the n-type current blocking layer and n-type transparent layer in order to inject current; a third process for diffusing zinc impurity to form current injection region by electrically connecting p-type electrode with p-type radiative layer over the surface of current blocking layer as n-type transparent layer; a fourth process for performing a photo-etching so as to separate each element; and a fifth process for forming respective electrodes over the surface and inside of element.

BRIEF DESCRIPTION OF THE DRAWINGS

The features and advantages of the process according to the present invention will now be explained hereinafter with reference to the accompanying drawings, wherein:

FIG. 2 is a diagram of prior LED array, in which

2(A) is a schematic diagram of a known LED array with heterojunction,

2(B) is a view of light-density of the inside of element, and

2(C) is a view of light-density of the external emission;

FIG. 3 shows a specific diagram of an LED array with respect to the present invention, in which 3(A) is a schematic diagram of an LED array according to the present invention, 3(B) is a view of internal light-density of element, and 3(C) is a view of light-density of the external emission; and FIG. 4(A) to (E) are views showing each stage of manufacturing the LED array according to the present invention.

DETAILED DESCRIPTION OF THE INVENTION

A preferred embodiment of the invention will now be explained in more detail with reference to the accompanying drawings, hereinafter.

Figure 1:
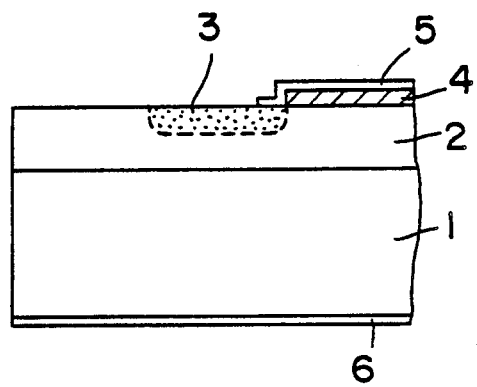
FIG. 1 is a schematic diagram of a known LED array with homojunction.
Figure 2A:
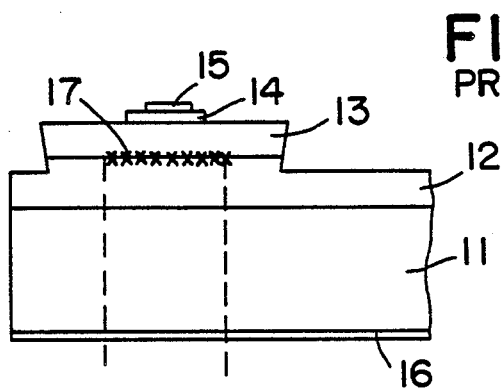
Figure 2B:
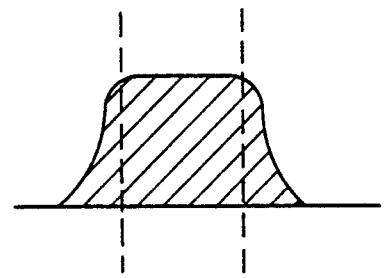
Figure 2C:
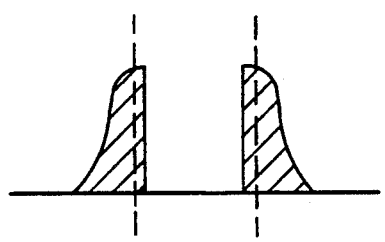
Figure 3A:
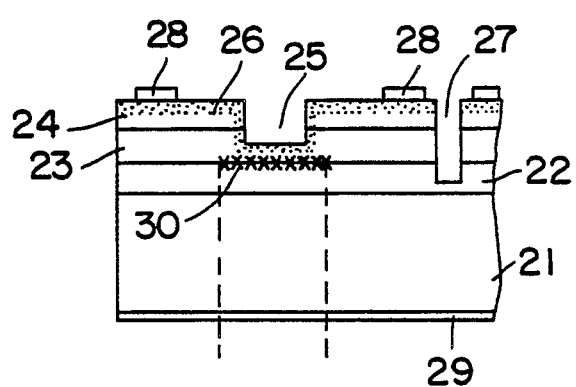
Figure 3B:
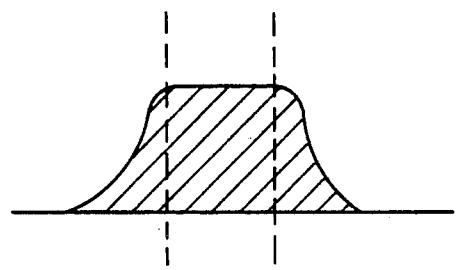
Figure 3C:
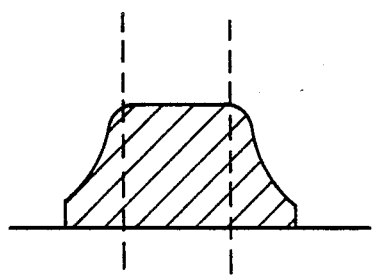

FIGS. 3(A) to (C) are respectively a schematic view, an internal light-density view and an external emission light-density view of GaAs LED array structure as a preferred embodiment according to the present invention.

When a voltage is applied to a p-type electrode 28, current flows not is said p-type electrode in perpendicular due to its p-n-p-n junction but in a current injection region 25 through zinc diffusion region 26 which is converted in p-type by zinc diffusion. A radiative region 30 is therefore formed under the current injection region 25, and then, the internal light formed within element as shown in FIG. 3(B) can be radiated to the outside without the disturbance of the p-type electrode 28, as shown in FIG. 3(C). If an energy gap of an n-type GaAlAs layer 24, as a current blocking layer, is wider than that of p-type GaAlAs radiative layer 23, there can be maximized the photo-emission efficiency because the n-type GaAlAs transparent layer 24 transmits the internally emitted light. Therefore the top n-type GaAlAs layer 24 plays both roles as a transparent layer and a current blocking layer.

Figure 4A:
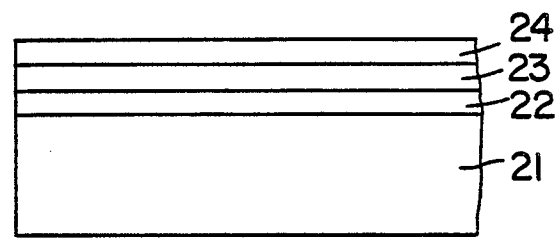
Figure 4B:
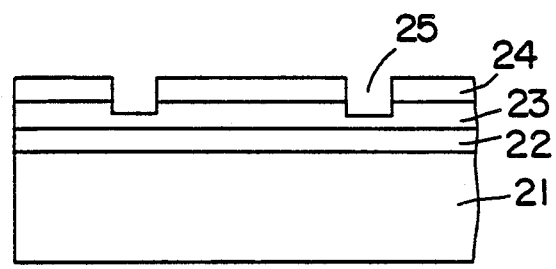

Referring now to the FIG. 4, there will be explained a preferred embodiment in detail. The starting material is an n-type GaAs single crystal substrate 21 with high concentrated n-type. As shown in FIG. 4(A), over the n-type GaAs substrate 21, by means of a conventional Liquid Phase Epitaxy, a first process is successively completed by growing an n-type GaAlAs junction layer 22, a p-type GaAlAs radiative layer 23 and an n-type current blocking layer 24 as an n-type GaAlAs transparent layer. Thereafter, by photo-etching, a portion of the n-type current blocking layer 24 of n-type GaAlAs transparent layer so as to make current injection region 25, thereby a second process is completed as shown in FIG. 4(B).

Figure 4C:
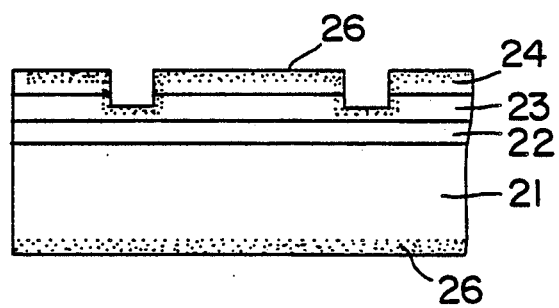

Thereafter, as shown in FIG. 4(C), a third process is executed by forming zinc diffusion region 26 by means of converting a portion of the current blocking layer 24 of said transparent layer into a p-type by using a conventional vacuum-sealing type zinc diffusion method. And then there is formed the zinc diffusion region 26 over the substrate 21 in said third process.

Figure 4D:
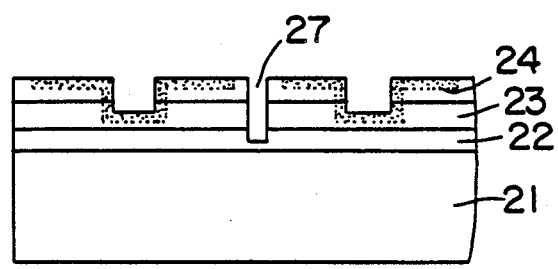
Figure 4E:
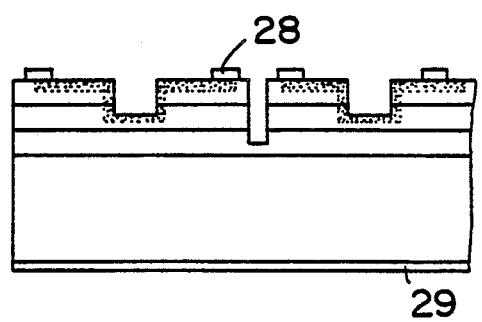

Therefore, in order to divide the element into a plurality of segments, region dividing elements 27 is formed by a photo-etching technique, and there is removed the zinc diffusion region by polishing the side of substrate, as shown in FIG. 4(D), thereby a fourth process is completed. Thereafter, as shown in FIG. 4(E), a fifth process is carried out by forming a p-type electrode 28 over the element and an n-type electrode under the substrate.

Accordingly the present invention, the inventive method, forms current injection region on other side of electrode by using zinc diffusion after growing heterogeneous film, so that the realization of a high optical power is possible because the light emitted in the internal element is efficiently radiated without the disturbance of the electrode.

Although specific constructions and procedures of the invention have been illustrated and described herein, it is not intended that the invention be limited to the elements and constructions disclosed. One skilled in the art will easily recognize that the particular elements or subconstructions may be used without departing from the scope and spirit of the invention.

What is claimed is:

1. A method of making an LED array, comprising:
   a first process for sequentially forming an n-type junction layer, a p-type radiative layer, a current blocking layer of an n-type transparent layer over an n-type semiconductor substrate;
   a second process for photo-etching said current blocking layer of the n-type transparent layer;
   a third process for diffusing zinc in order to form a current injection region;
   a fourth process for photo-etching for dividing the element into a plurality of segments and polishing the lower part of the element; and
   a fifth process for forming a plurality of electrodes at a upper and lower part of the LED array.

* * * * *